United States Patent
Cho

(10) Patent No.: US 9,991,728 B2
(45) Date of Patent: Jun. 5, 2018

(54) MONITORING SYSTEM FOR ENERGY STORAGE SYSTEM

(71) Applicant: LSIS CO., LTD., Anyang-si, Gyeonggi-do (KR)

(72) Inventor: Choong Kun Cho, Gunpo-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 123 days.

(21) Appl. No.: 14/964,432

(22) Filed: Dec. 9, 2015

(65) Prior Publication Data

US 2016/0301231 A1 Oct. 13, 2016

(30) Foreign Application Priority Data

Apr. 9, 2015 (KR) .................. 10-2015-0050035

(51) Int. Cl.
| | |
|---|---|
| *H02J 7/00* | (2006.01) |
| *H02J 7/04* | (2006.01) |
| *G01R 31/36* | (2006.01) |
| *H02J 3/32* | (2006.01) |

(52) U.S. Cl.
CPC ........ *H02J 7/0068* (2013.01); *G01R 31/3606* (2013.01); *H02J 3/32* (2013.01)

(58) Field of Classification Search
USPC ........ 320/134, 103, 107, 108, 109, 128, 137
See application file for complete search history.

(56) References Cited

U.S. PATENT DOCUMENTS

| | | | |
|---|---|---|---|
| 2002/0090962 A1* | 7/2002 | Struhsaker ............. | H01Q 1/246 455/462 |
| 2009/0058361 A1* | 3/2009 | John .................... | A61N 1/3785 320/128 |
| 2011/0106329 A1 | 5/2011 | Donnelly et al. | |

(Continued)

FOREIGN PATENT DOCUMENTS

| | | |
|---|---|---|
| CN | 102760332 A | 10/2012 |
| JP | 3177164 | 6/2001 |
| JP | 2006-332949 | 12/2006 |

(Continued)

OTHER PUBLICATIONS

Korean Intellectual Property Office Application Serial No. 10-2015-0050035, Office Action dated Jul. 13, 2016, 4 pages.

(Continued)

*Primary Examiner* — Alexis Pacheco
(74) *Attorney, Agent, or Firm* — K&L Gates LLP

(57) ABSTRACT

A monitoring system for an energy storage system is provided. The monitoring system for an energy storage system includes a power conversion system controlling charging and discharging of a battery; a charging control unit receiving data from the power conversion system and controlling the power conversion system; and a system control unit receiving data from the charging control unit and transmitting control data to the charging control unit, wherein the system control unit and the charging control unit transmit and receive data according to a priority if data traffic is equal to or higher than a certain level, and when the data traffic is the equal to or higher than the certain level, the charging control unit transmits data to the system control unit only if control data is not transmitted from the system control unit.

2 Claims, 2 Drawing Sheets

(56) References Cited

U.S. PATENT DOCUMENTS

2011/0215758 A1* 9/2011 Stahlin .................. G07C 5/008
                                                              320/109
2012/0268238 A1* 10/2012 Park ..................... G07F 15/006
                                                              340/5.8

FOREIGN PATENT DOCUMENTS

| JP | 2011-097676 | 5/2011 |
|---|---|---|
| JP | 2013-110951 | 6/2013 |
| JP | 5310157 | 10/2013 |
| JP | 2014-166073 | 9/2014 |
| JP | 2014-0122909 | 10/2014 |
| JP | 5645768 | 12/2014 |
| KR | 10-2010-0072953 | 7/2010 |
| KR | 10-1474296 | 12/2014 |

OTHER PUBLICATIONS

Chinese Office Action for related Chinese Application No. 201610049592.5; action dated Jan. 3, 2018; (5 pages).
Ruike Zhu, et al.; "An Additional Frequency Control Strategy for Interconnected Systems Through VSC-HVDC"; Automation of Electric Power Systems; Aug. 25, 2014; 7 pages; vol. 38, No. 16, DOI:10.7500/AEPS 20131023007; School of Electrical Engineering and Information, et al.; China.

* cited by examiner

MONITORING SYSTEM FOR ENERGY STORAGE SYSTEM

CROSS-REFERENCE TO RELATED APPLICATIONS

Pursuant to 35 U.S.C. § 119(a), this application claims the benefit of earlier filing date and right of priority to Korean Patent Application No. 10-2015-0050035, filed on Apr. 9, 2015, the contents of which are all hereby incorporated by reference herein in its entirety.

BACKGROUND

The present disclosure relates to a monitoring system, and more particularly to, a monitoring system for an energy storage system.

An energy storage system refers to an energy storage device that stores surplus power produced by a power plant or new renewable energy irregularly produced and then transmits it when there is a temporary power shortage.

In particular, the energy storage system refers to a system that stores electricity in an electrical power system in order to supply energy when needed and to places that need it. In other words, it is a storage assembly that a single product incorporates a system, like a typical secondary battery.

In generating wind power, new renewable energy that recently represents a rapid growth, the importance of the energy storage system comes to the fore as an essential device that stores power energy and then stably supplies energy to a power system when needed. If there is no energy storage system, the electrical system may have serious problems, such as sudden blackout due to instable power supply that depends on wind or sunlight. Thus, in this environment, the storage comes to the fore as a significantly important field and is expanded even to a home power storage system.

Such an energy storage system is being installed in a power station, a power transmission and distribution station, and home in the electrical system and performs functions, such as frequency regulation, generator output stabilization using new renewable energy, peak shaving, load leveling, a emergency power source.

The energy storage system is roughly divided into physical energy storage and chemical energy storage according to a storage method. The physical energy storage uses pumping-up power generation, compressed air storage, flywheel, etc. and the chemical energy storage uses a lithium ion battery, a lead storage battery, a Nas battery, etc.

A system control unit and a charging control unit in the energy storage system mutually transmit and receive data and when there is a lot of data traffic, there is a limitation in that it is difficult to rapidly transmit and receive required data.

SUMMARY

Embodiments provide a monitoring system that enables effective monitoring through smooth data transmission and reception between a system control unit and a charging control unit in an energy storage system.

Technical issues to be achieved in proposed embodiments are not limited to the technical issues as described above and other technical issues not mentioned would be clearly understood from the following descriptions by a person skilled in the art to which the proposed embodiments pertain.

In one embodiment, a monitoring system for an energy storage system includes a power conversion system controlling charging and discharging of a battery; a charging control unit receiving data from the power conversion system and controlling the power conversion system; and a system control unit receiving data from the charging control unit and transmitting control data to the charging control unit, wherein the system control unit and the charging control unit transmit and receive data according to a priority if data traffic is equal to or higher than a certain level, and when the data traffic is the equal to or higher than the certain level, the charging control unit transmits data to the system control unit only if control data is not transmitted from the system control unit.

The present disclosure has an advantage in that it is possible to provide a monitoring system that enables effective monitoring through smooth data transmission and reception between a system control unit and a charging control unit in an energy storage system.

The details of one or more embodiments are set forth in the accompanying drawings and the description below. Other features will be apparent from the description and drawings, and from the claims.

DETAILED DESCRIPTION OF THE EMBODIMENTS

Figure 1:
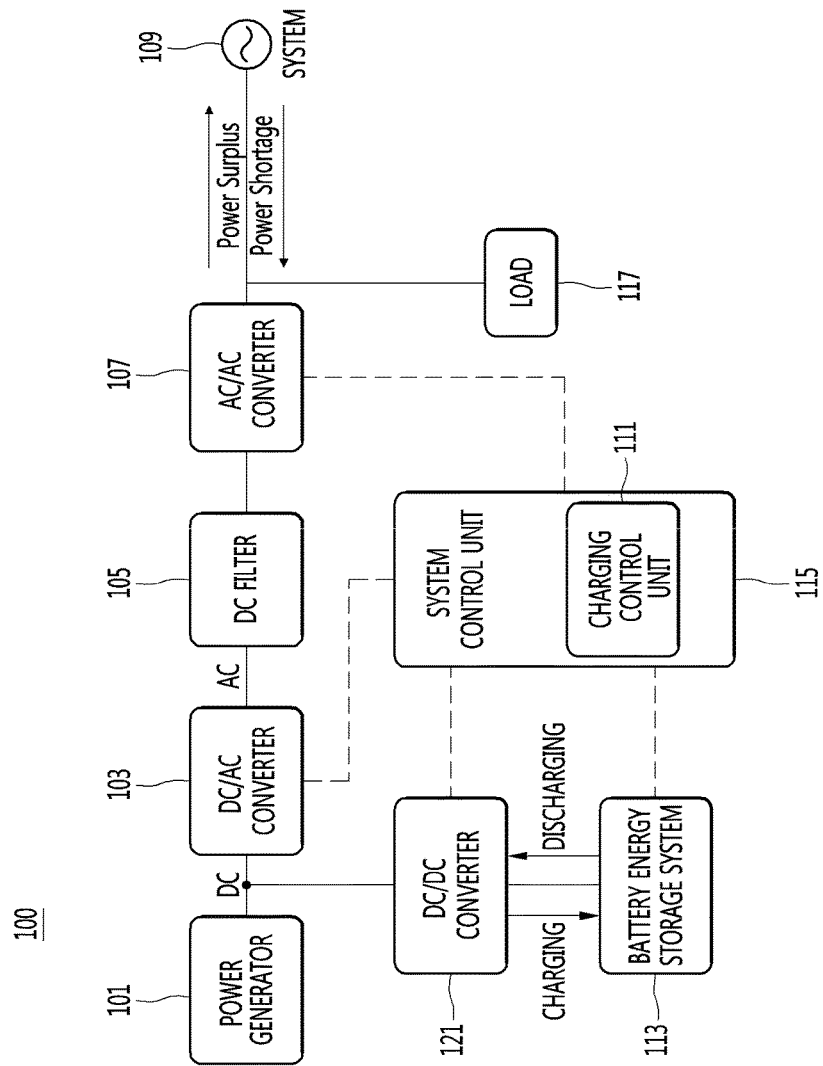
FIG. 1 is a block diagram of a generated-output power supply system according to an embodiment.

Embodiments are described below in more detail with reference to the accompanying drawings. In the following description, since the suffixes "module" and "unit" for components are given and interchanged for easiness in making the present disclosure, they do not have distinct meanings or functions.

The effects and features of an embodiment, and implementation methods thereof will be clarified through following embodiments described with reference to the accompanying drawings. An embodiment may, however, be embodied in different forms and should not be construed as limited to the embodiments set forth herein. Rather, these embodiments are provided to make this disclosure thorough and complete and fully convey the scope of an embodiment to a person skilled in the art. Further, the present invention is only defined by scopes of claims. The same reference numerals throughout the disclosure refer to the same components.

When describing embodiments, detailed descriptions related to known functions or configurations will be ruled out in order not to unnecessarily obscure subject matters of the embodiments. In addition, since the terms used herein are defined in consideration of functions in the embodiments, they may vary depending on an operator intention or practice. Therefore, the definitions needs to be made based on details throughout the present invention.

Each block of the accompanying drawings and combinations of each step of a flowchart may also be performed by computer program instructions. Since the computer program instructions may be loaded on the processor of a general-purpose computer, a special-purpose computer or other programmable data processing equipment, the instructions performed by the processor of the computer or other programmable data processing equipment create means that performs functions described on each block of a drawing or each step of a flowchart. Since the computer program instructions may also be stored in a computer usable or computer readable memory that may aim at the computer or other programmable data processing equipment in order to implement functions in a specific manner, the instructions stored in the computer usable or computer readable memory may also produce an item that includes an instruction means performing functions described on each block of a drawing or each step of a flowchart. The computer program instructions may also be loaded on the computer or other programmable data processing equipment. Thus, since a series of operation steps are performed on the computer or other programmable data processing equipment to create processes executed by a computer, instructions operating the computer or other programmable data processing equipment may also provide steps for performing functions described on each block of a drawing and each step of a flowchart.

Also, each block or each step may represent a portion of a module, a segment or a code that includes one or more executable instructions for performing specific logical function(s). Also, it should be noted that some alternative embodiments may be performed in such a way that functions mentioned at blocks or steps are performed in a different order. For example, two blocks or steps shown one after another may also be performed substantially at the same time or the blocks or steps may also be sometimes performed in a reverse order according to a corresponding function.

FIG. 1 is a block diagram of a generated-output power supply system according to an embodiment.

A power supply system 100 according to an embodiment includes a power generator 101, a direct current/alternating current (DC/AC) converter 103, an AC filter 105, an AC/AC converter 107, a system 109, a charging control unit 111, a battery energy storage system 113, a system control unit 115, a load 117 and a DC/DC converter 121.

The power generator produces electrical energy. In the case that the power generator is a solar power generator, the power generator 101 may be a solar battery array. The solar battery array is obtained by coupling a plurality of solar battery modules. The solar battery module is a device in which a plurality of solar batteries is connected in series or parallel to convert solar energy into electrical energy to generate a certain voltage and current. Thus, the solar battery array absorbs solar energy to convert it into electrical energy. Also, in the case that a power system is a wind power system, the power generator 101 may be a fan that converts wind energy into electrical energy. However, the power supply system 100 may supply power through only the battery energy storage system 113 without the power generator 101, as described earlier. In this case, the power supply system 100 may not include the power generator 101.

The DC/AC converter 103 converts DC power into AC power. The DC power supplied by the power generator 101 or the DC power discharged by the battery energy storage system 113 is converted into AC power.

The AC filter 105 filters the noise of power converted into AC power. In a particular embodiment, the AC filter 105 may be omitted.

In order to be capable of supplying AC power to the system 109 or the load 117, the AC/AC converter 107 converts the size of a voltage of noise-filtered AC power to supply power to the system 109 or an independent load. In a particular embodiment, the AC/AC converter 107 may be omitted.

The system 109 is a system that incorporates many power stations, substations, power transmission and distribution cables, and loads to generate and use power.

The load 117 receives electrical energy from a power system to consume power. The battery energy storage system 113 receives and charges electrical energy from the power generator 101 and discharges the charged electrical energy according to the power supply and demand situation of the system 109 or the load 117. In particular, when the system 109 or the load 117 is a light load, the battery storage system 113 receives and charges idle power from the power generator 101. When the system 109 or the load 117 is an overload, the battery energy storage system 113 discharges charged power to supply power to the system 109 or the load 117. The power supply and demand situation of the system 109 or the load 117 may have a big difference according to a time zone. Thus, it is ineffective for the power supply system 100 to uniformly supply power supplied by the power generator 101 without considering the power supply and demand situation of power. Therefore, the power supply system 100 uses the battery energy storage system to regulate an amount of power to be supplied according to the power supply and demand situation of the system 109 or the load 117. Accordingly, the power supply system 100 may efficiently supply power to the system 109 or the load 117.

The DC/DC converter 121 converts the size of DC power that the battery energy storage system 113 supplies or receives. In a particular embodiment, the DC/DC converter 121 may be omitted.

The system control unit 115 controls the operations of the DC/AC converter 103 and the AC/AC converter 107. Also, the system control unit 115 may include a charging control unit 111 that controls the charging and discharging of the battery energy storage system 113. The charging control unit 111 controls the charging and discharging of the battery energy storage system 113. When the system 109 or the load 117 is the overload, the charging control unit 111 enables the battery energy storage system 113 to supply power to transmit the power to the system 109 or the load 117. When the system 109 or the load 117 is the light load, the charging control unit 111 enables an external power supply source or the power generator 101 to supply power to transmit the power to the battery energy storage system 113.

The battery energy storage system 113 may include a battery management system (BMS) that performs the functions of controlling a battery and the charging and discharging of the battery, notifying and managing a charged state, battery information, etc. through an external interface, and protecting the battery from overcharging/overdischaraging. The battery energy storage system 113 may be disposed in plurality at a plurality of sites.

Also, the DC/DC converter 121, the DC/AC converter 103, and the AC/AC converter 107 may be included in a power conversion system, which may also be a power conditioning system (PCS) that converts the voltage and frequency characteristics of electrical energy.

The charging control unit 111 may include a power management system (PMS) for controlling the charging and discharging of the battery energy storage system 113.

The system control unit 115 may be included in an energy management system (EMS).

The charging control unit 110 monitors the state of the battery and monitors the of the power conversion system.

The charging/discharging of the battery is performed through the power conversion system. Also, the charging control unit 111 may control the power conversion system based on data on the battery received from the BMS. Also, the charging control unit 111 may also control the power conversion system disposed at the plurality of sites, according to its efficiency.

The BMS is connected to the battery and delivers the protection operation of the battery and the state of the battery to the system control unit 115. In order to protect the battery, the BMS may perform an overcharging protection function, an overdischarging protection function, an overcurrent protection function, an overvoltage protection function, an overheat protection function, a cell balancing function, etc. To this end, the BMS monitors the voltage, current, temperature, remaining power amount, lifespan, charged state, etc. of the battery and transmits related information to the system control unit 115.

The charging control unit 111 monitors the state of the battery through the BMS to transmit the data to the system control unit 115.

The system control unit 115 controls the battery from the BMS disposed at each site through the charging control unit 111, and the charging control unit 111 provides, to the system control unit 115, fault information, general monitoring information, information on an accumulated data history on the battery disposed at each site.

Figure 2:
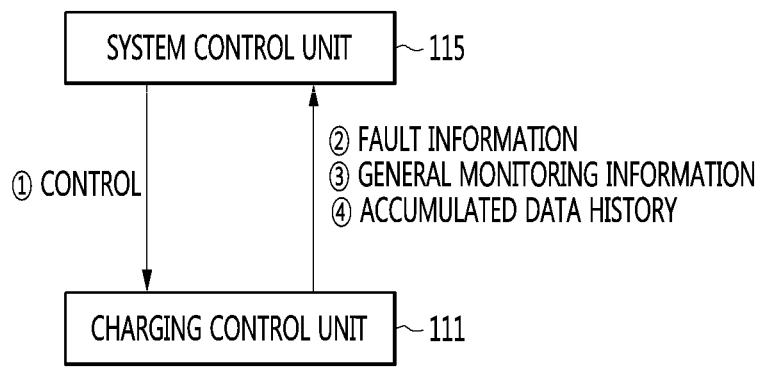
FIG. 2 is a diagram for explaining a monitoring system for an energy storage system according to an embodiment.

FIG. 2 is a diagram for explaining a monitoring system for an energy storage system according to an embodiment.

Referring to FIG. 2, the charging control unit 111 and the system control unit 115 are connected to each other to transmit and receive data. As a typical example, control data is transmitted from the system control unit 115 to the charging control unit 111 so that the power conversion system may be controlled.

Also, the charging control unit 111 may transmit data, such as fault information, general monitoring information, an accumulated data history, etc. to the system control unit 115 so that the system control unit 115 may recognize the state of the energy storage system and control it correspondingly.

In transmitting and receiving data between the system control unit 115 and the charging control unit 111, there is a limitation in that data may not be transmitted at an appropriate time when there is a lot of data traffic.

Thus, in transmitting and receiving data between the system control unit 115 and the charging control unit 111 in the embodiment, the system control unit 115 and the charging control unit 111 detects data traffic to perform data transmission and reception according to a priority when the data traffic is equal to or higher than a certain level.

For example, when the data traffic between the system control unit 115 and the charging control unit 111 is equal to or higher than a certain level, control data is preferentially transmitted and received and when there is no control data, fault information data, general monitoring information data, an accumulated data history, etc. are sequentially transmitted and received.

That is, when the data traffic is equal to or higher than a certain level, the charging control unit 111 receives the control data from the system control unit 115 and transmits data to the system control unit 115 according to a priority when there is no control data.

Figure 3:
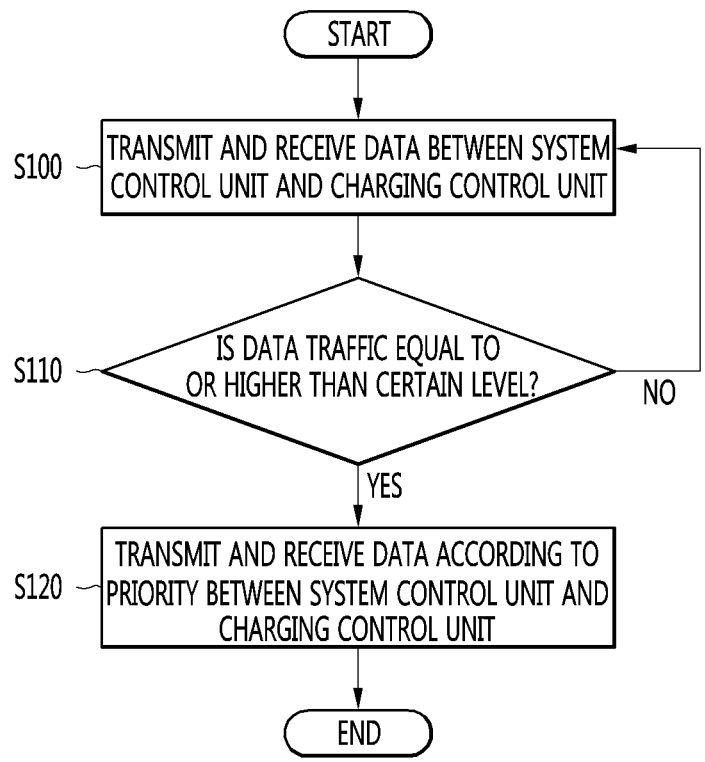
FIG. 3 is a diagram for explaining a monitoring method of an energy storage system according to an embodiment.

FIG. 3 is a diagram for explaining a monitoring method of an energy storage system according to an embodiment.

Referring to FIG. 3, when there is no data traffic, the data transmission and reception between the system control unit 115 and the charging control unit 111 is normally performed, in which case data may be transmitted in the order of generation without a priority, in step S100.

The system control unit 115 and the charging control unit 111 checks data traffic and detects whether the data traffic is equal to or higher than a certain level in step S110.

When the data traffic is equal to or higher than a certain level, the system control unit 115 and the charging control unit 111 starts data transmission and reception according to a priority in step S120.

Thus, the system control unit 115 and the charging control unit 111 control data firstly transmit and receive control data according to a priority when the data traffic is equal to or higher than a certain level, and transmit and receive fault information data, general monitoring information data, accumulated data history data, etc. when there is no control data.

As described above, the monitoring system and method of the energy storage system according to an embodiment may effectively monitor through priority-based data transmission and reception according to data traffic between the system control unit 115 and the charging control unit 111.

What is claimed is:

1. A monitoring system for an energy storage system, the monitoring system comprising:
   a power conversion system controlling charging and discharging of a battery;
   a charging control unit receiving data from the power conversion system and controlling the power conversion system; and
   a system control unit receiving data from the charging control unit and transmitting control data to the charging control unit when data traffic between the system control unit and the charging control unit is lower than a certain level,
   wherein the system control unit transmits the control data to the charging control unit according to a priority if the data traffic is equal to or higher than the certain level, and the charging control unit transmits the data to the system control unit when the control data according to the priority is not transmitted from the system control unit.

2. The monitoring system according to claim 1, wherein the data includes fault information data, general monitoring information data, and accumulated data history.

* * * * *